(12) United States Patent
Kushida

(10) Patent No.: US 8,284,592 B2
(45) Date of Patent: Oct. 9, 2012

(54) SEMICONDUCTOR MEMORY DEVICE AND METHOD OF UPDATING DATA STORED IN THE SEMICONDUCTOR MEMORY DEVICE

(75) Inventor: Keiichi Kushida, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 248 days.

(21) Appl. No.: 12/726,288

(22) Filed: Mar. 17, 2010

(65) Prior Publication Data
US 2011/0051530 A1   Mar. 3, 2011

(30) Foreign Application Priority Data
Aug. 26, 2009   (JP) ................................. 2009-195422

(51) Int. Cl.
G11C 11/00 (2006.01)
G11C 7/00 (2006.01)

(52) U.S. Cl. .................. 365/154; 365/156; 365/189.011
(58) Field of Classification Search .................... 365/154
See application file for complete search history.

(56) References Cited

U.S. PATENT DOCUMENTS

| 4,839,909 | A  | * | 6/1989  | Warner ........................ 377/24.1 |
| 6,034,886 | A  | * | 3/2000  | Chan et al. .................... 365/154 |
| 6,353,552 | B2 | * | 3/2002  | Sample et al. ................ 365/154 |
| 6,470,467 | B2 | * | 10/2002 | Tomishima et al. .......... 714/744 |
| 6,639,827 | B2 | * | 10/2003 | Clark et al. .................... 365/154 |
| 6,728,156 | B2 | * | 4/2004  | Kilmer et al. ................. 365/222 |
| 6,871,305 | B2 | * | 3/2005  | Chien et al. ................... 714/718 |
| 7,009,905 | B2 |   | 3/2006  | Aipperspach et al. |
| 7,301,797 | B2 | * | 11/2007 | Kimura ......................... 365/154 |
| 7,310,281 | B1 | * | 12/2007 | Hsueh et al. .................. 365/222 |
| 7,483,290 | B2 | * | 1/2009  | Kikuchi et al. ............... 365/154 |
| 7,639,546 | B2 | * | 12/2009 | Kikuchi et al. .......... 365/189.05 |
| 2005/0213371 | A1 | * | 9/2005  | Kimura ......................... 365/154 |
| 2011/0267914 | A1 | * | 11/2011 | Ishikura et al. ............... 365/208 |

FOREIGN PATENT DOCUMENTS

JP    2006-252696     9/2006
JP    2007-323770 A   12/2007

OTHER PUBLICATIONS

Kumar et al., "Impact of NBTI on SRAM Read Stability and Design for Reliability and Design for Reliability," ISQED '06 Proceedings of the 7th International Symposium on Quality Electronic Design, 2006, IEEE.
Notice of Rejection mailed by the Japan Patent Office on Sep. 20, 2011 in corresponding Japanese Patent App. No. 2009-195422 in 6 pages.

* cited by examiner

*Primary Examiner* — Son Mai
(74) *Attorney, Agent, or Firm* — Knobbe, Martens, Olson Bear, LLP

(57) ABSTRACT

The semiconductor memory device executes, in address units, operation for inverting data stored in a memory cell designated by an internal address and writing the data in the memory cell and increments the internal address every time inversion writing operation for the memory cell is executed.

19 Claims, 6 Drawing Sheets

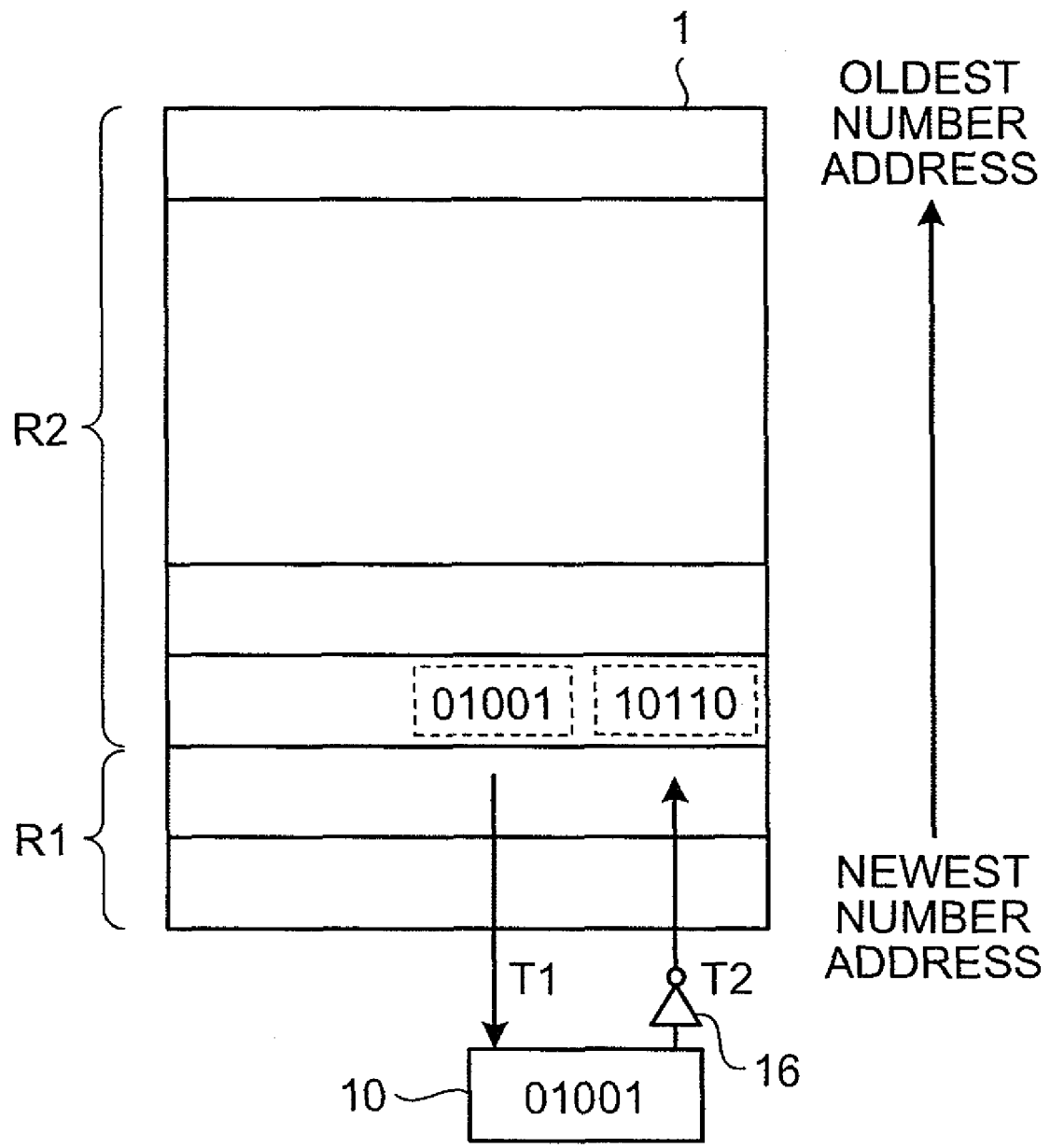

SEMICONDUCTOR MEMORY DEVICE AND METHOD OF UPDATING DATA STORED IN THE SEMICONDUCTOR MEMORY DEVICE

CROSS-REFERENCE TO RELATED APPLICATIONS

This application is based upon and claims the benefit of priority from the prior Japanese Patent Application No. 2009-195422, filed on Aug. 26, 2009; the entire contents of which are incorporated herein by reference.

BACKGROUND OF THE INVENTION

1. Field of the Invention

The present invention relates to a semiconductor memory device and a method of updating data stored in the semiconductor memory device, and, more particularly is suitably applied to a method of reducing deterioration in a data storage characteristic due to deviation of ON time of a P-channel field effect transistor included in a static random access memory (SRAM).

2. Description of the Related Art

It is known that the P-channel field effect transistor is deteriorated with time because of negative bias temperature instability (NBTI). The aged deterioration due to the NBTI is a phenomenon in which, when an ON state of the P-channel field effect transistor lasts for a long time under a high-temperature condition (e.g., when a source voltage and a drain voltage are 0 volt and a gate voltage is a negative bias), a threshold voltage of the P-channel field effect transistor rises and a current driving ability thereof falls.

When the aged deterioration due to the NBTI occurs only in one of a pair of P-channel field effect transistors included in a SRAM cell, in some case, the balance of a latch characteristic of the SRAM cell is broken and data stored in the SRAM cell is lost.

For example, Japanese Patent Application Laid-Open No. 2006-252696 discloses a method of enabling an electronic system realized by a field effect transistor (FET) to reduce a threshold voltage shift due to bias temperature instability (BTI) by guaranteeing that a specific storage element is in a first state in a period of a first section of time in which the electronic system operates and, in that period, data is stored in the storage element in a first phase and that the specific storage element is in a second state in a period of a second section in the time in which the electronic system operates and, in that period, data is stored in the storage device in a second phase.

However, in the method disclosed in Japanese Patent Application Laid-Open No. 2006-252696, when a memory cell array includes a large number of memory cells, if memory cells in which data is inverted and memory cells in which data is not inverted are mixed, the data stored in the respective memory cells cannot be accurately read out.

BRIEF SUMMARY OF THE INVENTION

A semiconductor memory device according to an embodiment of the present invention comprises: a memory cell array in which memory cells are arranged in a matrix shape; an inversion writing circuit configured to execute operation for inverting data stored in the memory cells and writing the inverted data in the memory cells; an address counter configured to either increment or decrement an internal address every time the inversion writing circuit executes the inversion writing operation; and a decoder configured to select, based on the internal address designated by the address counter, a memory cell in which the inversion writing circuit executes the inversion writing operation.

A semiconductor memory device according to an embodiment of the present invention comprises: a memory cell array in which memory cells are arranged in a matrix shape; a row decoder configured to select a memory cell in which readout or writing is performed in a row direction; a column decoder configured to select a memory cell in which readout or writing is performed in a column direction; a sense amplifier configured to amplify a signal read out from the memory cell to detect whether data stored in the memory cell is a logical value 0 or a logical value 1; a word line configured to transmit a signal exchanged between the row decoder and the memory cell; a bit line configured to transmit a signal exchanged between the sense amplifier and the memory cell; an address counter configured to generate an internal address; an address comparator configured to compare the internal address generated by the address counter and an external address input from an outside and determines whether an inverted region is designated or a non-inverted region is designated by the external address; an NOP controller configured to instruct to read out data from the memory cell, invert the read-out data, and write the data in the memory cell during a standby cycle; a register configured to store the data detected by the sense amplifier; a first inverter configured to invert the data stored in the register; a second inverter configured to invert written data; a first selector configured to select, based on a result of the comparison of the address comparator, a detection value of a signal of one of bit lines that form a complementary pair; a second selector configured to select, based on the result of the comparison of the address comparator, the written data or data inverted by the second inverter; a third selector configured to select, based on an instruction from the NOP controller, the data selected by the second selector or the data inverted by the first inverter; and a data latch/writing control circuit configured to set, according to the data selected by the third selector, potential of the bit line to a high level or a low level.

A method of updating data stored in a semiconductor memory device comprises: reading out, in a standby cycle, data stored in memory cells arranged in a matrix shape in a memory cell array, inverting the read-out data, and writing the data in the memory cells; determining whether a region designated by an external address in a readout cycle is an inverted region or a non-inverted region; outputting, when the region designated by the external address is the inverted region, data obtained by inverting data read out from the memory cells in the readout cycle; outputting, when the region designated by the external address is the non-inverted region, the data read out from the memory cells in the readout cycle without inverting the data; determining whether a region designated by an external address in a writing cycle is the inverted region or the non-inverted region; writing, when the region designated by the external address is the inverted region, data obtained by inverting written data in the memory cells in the writing cycle; and writing, when the region designated by the external address is the non-inverted region, the written data in the memory cells without inverting the written data in the writing cycle.

BRIEF DESCRIPTION OF THE DRAWINGS

FIG. 4 is a diagram of an address map of inverted data inverted by the semiconductor memory device shown in FIG. 1;

DETAILED DESCRIPTION OF THE INVENTION

Exemplary embodiments of the present invention are explained in detail below with reference to the accompanying drawings. The present invention is not limited by the embodiments.

Figure 1:
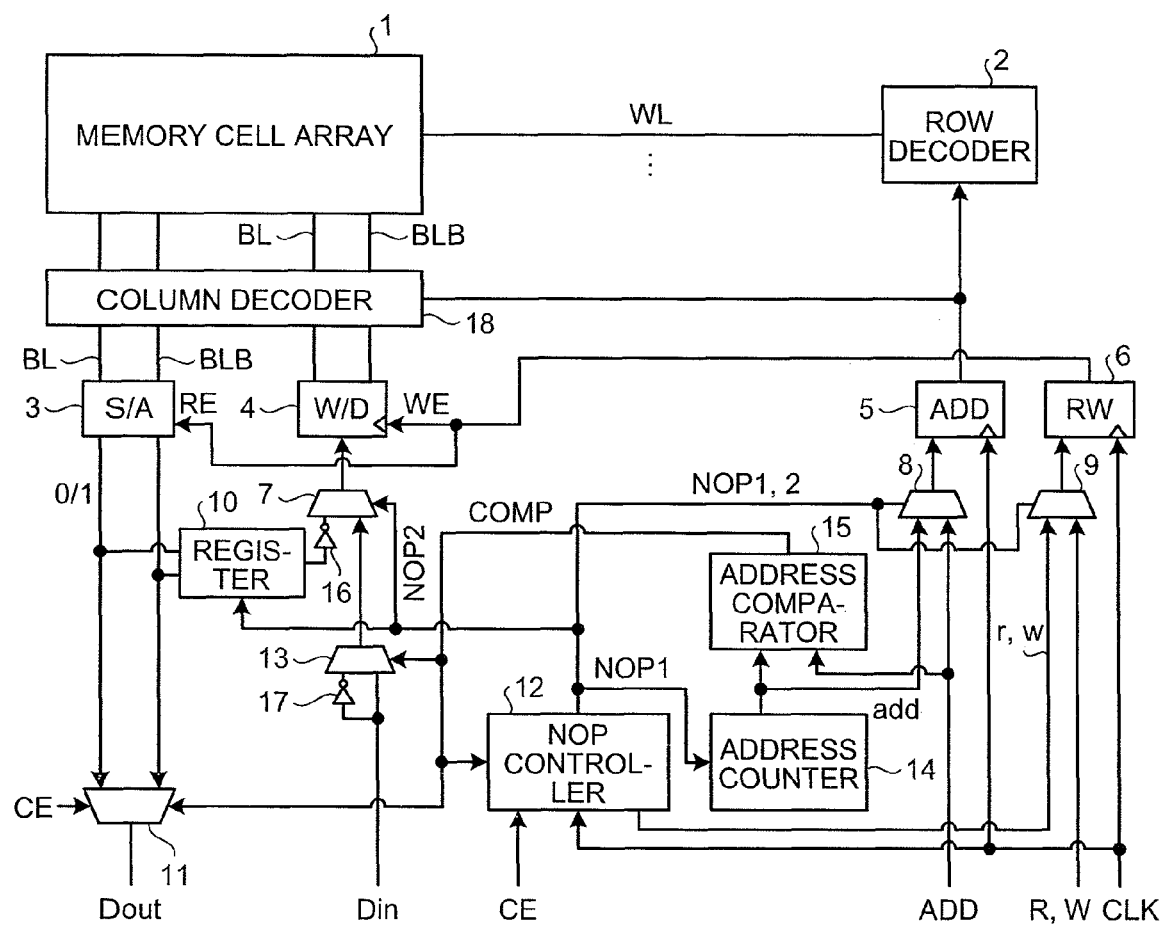
FIG. 1 is a block diagram of the schematic configuration of a semiconductor memory device according to a first embodiment of the present invention.

FIG. 1 is a block diagram of the schematic configuration of a semiconductor memory device according to a first embodiment of the present invention.

In FIG. 1, the semiconductor memory device includes a memory cell array 1, a row decoder 2, a sense amplifier 3, and a data latch/writing control circuit 4. Memory cells are arranged in a matrix shape in the memory cell array 1. The memory cell array 1 includes word lines WL that transmit signals exchanged between the row decoder 2 and the memory cells and bit lines BL and BLB that transmit signals exchanged between the sense amplifier 3 and the memory cells. The word lines WL are connected to the row decoder 2 and the bit lines BL and BLB are connected to the sense amplifier 3 and the data latch/writing control circuit 4. The bit lines BL and BLB can transmit signals to one memory cell in a complementary manner each other.

The row decoder 2 selects a memory cell from which a signal is read out or in which a signal is written in a row direction via the word lines WL. The sense amplifier 3 amplifies a signal read out from the memory cell to detect whether data stored in the memory cell is a logical value 0 or a logical value 1. The data latch/writing circuit 4 sets the potential of the bit lines BL and BLB to a high level or a low level according to data written in the memory cell. The column decoder 18 selects a memory cell from which a signal is read out or in which a signal is written in a column direction via the bit lines BL and BLB.

Further, the semiconductor memory device includes an address latch circuit 5, a readout/writing control circuit 6, selectors 7 to 9, 11, and 13, a register 10, an NOP controller 12, an address counter 14, an address comparator 15, and inverters 16 and 17.

The address latch circuit 5 latches, in synchronization with a clock signal CLK, an external address ADD input from the outside and an internal address add generated by the address counter 14 and outputs the external address ADD and the internal address add to the row decoder 2 and the column decoder 18. The readout/writing control circuit 6 outputs a read enable signal RE to the sense amplifier 3 according to a readout instruction and outputs a write enable signal to the data latch/writing control circuit 4 according to a writing instruction. The register 10 stores output data from the sense amplifier 3 according to an instruction from the NOP controller 12. The NOP controller 12 instructs the register 10 to read out data from a memory cell, invert the read-out data, and write the inverted data in the memory cell during a standby cycle. The address counter 14 increments the internal address add every time the NOP controller 12 instructs the register 10 to read out data from a memory during the standby cycle. The address comparator 15 compares the external address ADD and the internal address add and outputs a comparison result COMP of the comparison to the NOP controller 12 and the selectors 11 and 13. The selector 13 selects, based on an instruction from the NOP controller 12, written data Din or an output (an inverted signal of the written data Din) from the inverter 17 and outputs the written data Din or the output to the selector 7. The selector 7 selects, based on an instruction from the NOP controller 12, an output from the register 10 or an output from the selector 13 output via the inverter 16 and outputs the output to the data latch/writing control circuit 4. The selector 11 selects, based on the comparison result COMP, a signal of one of the bit lines BL and BLB and outputs the signal as read-out data Dout. The selector 8 selects, based on an instruction from the NOP controller 12, the external address ADD or the internal address add and outputs the address to the address latch circuit 5. The selector 9 selects, based on an instruction from the NOP controller 12, an external readout signal R and an external writing signal W or an internal readout signal r and an internal writing signal w and outputs the signal to the readout/writing control circuit 6.

Figure 2:
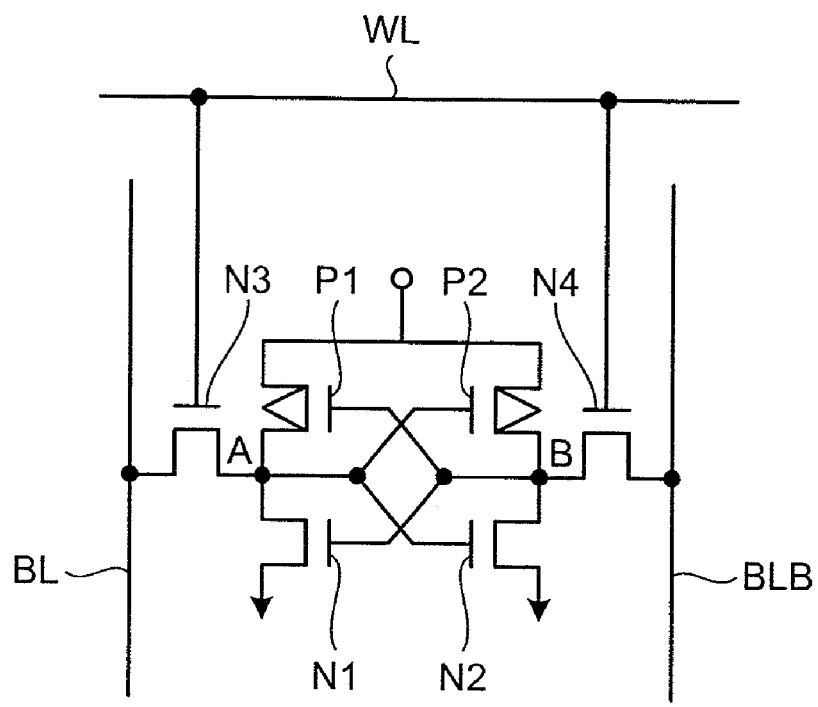
FIG. 2 is a circuit diagram of the schematic configuration of a memory cell included in a memory cell array 1 shown in FIG. 1.

FIG. 2 is a circuit diagram of the schematic configuration of a memory cell included in the memory cell array 1 shown in FIG. 1.

In FIG. 2, a SRAM memory cell includes P-channel field effect transistors (hereinafter, "Pch transistors") P1 and P2 and N-channel field effect transistors (hereinafter, "Nch transistors") N1 to N4. The Pch transistor P1 and the Nch transistor N1 are connected to each other in series to form a CMOS inverter. The Pch transistor P2 and the Nch transistor N2 are connected to each other in series to form a CMOS inverter. Outputs and inputs of the pair of CMOS inverters are cross-coupled to each other to form a flip flop.

A gate of the Pch transistor P1, a gate of the Nch transistor N1, a drain of the Pch transistor P2, and a drain of the Nch transistor N2 are connected to one another to form a storage node B. A gate of the Pch transistor P2, a gate of the Nch transistor N2, a drain of the Pch transistor P1, and a drain of the Nch transistor N1 are connected to one another to form a storage node A.

The storage node A is connected to the bit line BL via the Nch transistor N3. The storage node B is connected to the bit line BLB via the Nch transistor N4. A gate of the Nch transistor N3 and a gate of the Nch transistor N4 are connected to the word line WL.

In an example shown in FIG. 2, the SRAM memory cell including six transistors is shown. However, the semiconductor memory device can also be applied to a SRAM memory cell including eight transistors. The semiconductor memory device can also be applied to a SRAM memory cell including ten transistors. A semiconductor memory device in which a cell characteristic is deteriorated when data is stored therein can be applied to a memory cell other than the SRAM memory cell.

Figure 3:
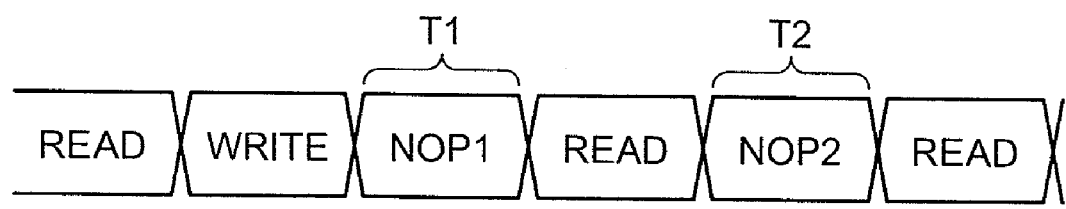
FIG. 3 is a timing chart of inversion timing for data stored in the semiconductor memory device shown in FIG. 1.

FIG. 3 is a timing chart of inversion timing for data stored in the semiconductor memory device shown in FIG. 1.

In FIG. 3, in cycles specified the clock signal CLK shown in FIG. 1, any one of a read state, a write state, and a standby state is selected. A chip enable signal CE designates which state the present cycle is. The chip enable signal CE is input to the NOP controller 12.

In a period T1, when the standby state is designated by the chip enable signal CE, the NOP controller 12 detects that the present cycle is the standby state. The NOP controller 12 outputs a standby detection signal NOP1 to the address counter 14, the selectors 8 and 9, and the register 10. The NOP controller 12 outputs an internal readout signal r to the selector 9.

When the standby detection signal NOP1 is input to the address counter 14, the address counter 14 increments the internal address add generated last time and directly stores the internal address add in the address counter 14. When the standby detection signal NOP1 is input to the selector 8, the selector 8 selects the incremented internal address add and outputs the internal address add to the row decoder 2 and the column decoder 18. The row decoder 2 and the column decoder 18 select the word line WL designated by the internal address add and read out data stored in a memory cell selected by the word line WL to the bit lines BL and BLB designated by the internal address add.

When the standby detection signal NOP1 is input to the selector 9, the selector 9 selects the internal readout signal r output from the NOP controller 12 and outputs the internal readout signal r to the readout/writing control circuit 6. The readout/writing control circuit 6 outputs the read enable signal RE to the sense amplifier 3. The sense amplifier 3 determines, based on the signal read out from the memory cell to the bit lines BL and BLB, whether the data stored in the memory cell is a logical value 0 or a logical value 1 and outputs data to the register 10. The register 10 stores, based on the standby detection signal NOP1, the data output from the sense amplifier 3.

Subsequently, when the next standby state is designated in a period T2, the NOP controller 12 detects that the present cycle is the standby state. The NOP controller 12 outputs a standby detection signal NOP2 to the address counter 14 and the selectors 7 to 9 and outputs the internal writing signal w to the selector 9.

When the standby detection signal NOP2 is input to the address counter 14, the address counter 14 stores the internal address add same as the internal address add output to the selector 8 when the standby detection signal NOP1 is received. The selector 8 selects the internal address add and outputs the internal address to the row decoder 2 and the column decoder 18 via the address latch circuit 5. The row decoder 2 and the column decoder 18 select the word line WL and the bit lines BL and BLB designated by the internal address add.

When the standby detection signal NOP2 is input to the selector 7, the selector 7 selects data input from the register 10 via the inverter 16. The selector 7 outputs inverted data of the register 10 to the latch/writing control circuit 4.

When the standby detection signal NOP2 is input to the selector 9, the selector 9 selects the internal writing signal w and outputs the internal writing signal w to the readout/writing control circuit 6. The readout/writing control circuit 6 outputs the write enable signal WE to the data latch/writing control circuit 4. The data latch/writing control circuit 4 sets, based on the output of the selector 7, the potential of the bit lines BL and BLB designated by the internal address add. The data latch/writing control circuit 4 writes data obtained by inverting the data read out from the memory cell in the period T1 in a memory cell designated by the internal address add.

The NOP controller 12 alternately outputs the standby detection signals NOP1 and NOP2 every time the NOP controller 12 detects that the present cycle is the standby state. The address counter 14 increments the address counter for the standby detection signal NOP1. Consequently, data corresponding to all addresses on a memory space of the memory cell array 1 are inverted and written in the memory cell.

FIG. 4 is a diagram of an address map of inverted data inverted by the semiconductor memory device shown in FIG. 1.

In FIG. 4, it is assumed that data '01001' is stored in a region designated by the internal address add. When the standby state is detected in the period T1, the data '01001' is read out from the internal address add and stored in the register 10.

Subsequently, when the next standby state is detected in the period T2, the data '01001' stored in the register 10 is inverted to generate data '10110'. The data '10110' is written in a region designated by the internal address add. In other words, the inverted data is stored in the internal address add.

Until the data corresponding to all the addresses on the memory space of the memory cell array 1 are inverted, an inverted region R1 and a non-inverted region R2 are mixed in the memory cell array 1. In this case, the internal address add is incremented every time inversion writing operation is executed in address units. This makes it possible to regularly generate the inverted region R1 from a lowest number address to an highest number address and determine a boundary between the inverted region R1 and the non-inverted region R2 referring to the internal address add.

On the other hand, when the read state or the write state is designated by the chip enable signal CE, the NOP controller 12 detects that the present cycle is not the standby state. The NOP controller 12 stops the output of the standby detection signals NOP1 and NOP2.

When data is read out from a memory cell in a state in which the read state or the write state is designated by the chip enable signal CE, the external address ADD is input to the selector 8 and the address comparator 15 and the external readout signal R is input to the selector 9.

When the external address ADD is input to the selector 8 in a state in which the output of the standby detection signals NOP1 and NOP2 is stopped, the selector 8 selects the external address ADD and outputs the external address ADD to the row decoder 2 and the column decoder 18. When the external address ADD is output to the row decoder 2 and the column decoder 18, the row decoder 2 and the column decoder 18 select the word line WL and the bit lines BL and BLB designated by the external address ADD. Data stored in a memory cell selected by the word line WL is read out to the bit lines BL and BLB designated by the external address ADD.

When the external readout signal R is input to the selector 9 in the state in which the output of the standby detection signals NOP1 and NOP2 is stopped, the selector 9 selects the external readout signal R and outputs the external readout signal R to the readout/writing control circuit 6. The readout/writing control circuit 6 outputs the read enable signal RE to the sense amplifier 3. The sense amplifier 3 determines, based on the signal read out from the memory cell to the bit lines BL and BLB, whether data stored in the memory cell is the logical value 0 or the logical value 1 and outputs the data to the selector 11.

When the external address ADD is input to the address comparator 15, the address comparator 15 compares the external address ADD and the internal address add and outputs a comparison result COMP of the comparison to the selector 11. When the external address ADD is higher in number than the internal address add, the selector 11 selects a signal on the bit line BL side and outputs the signal as the read-out data Dout. On the other hand, when the external address ADD is lower in number than the internal address add, the selector 11 selects a signal on the bit line BLB side and outputs the signal as the read-out data Dout.

When the external address ADD and the internal address add are equal, the NOP controller 12 determines whether the present readout cycle is between a standby cycle in the period T1 and a standby cycle in the period T2 shown in FIG. 3. When the present readout cycle is between the standby cycle in the period T1 and the standby cycle in the period T2 shown in FIG. 3, the selector 11 selects a signal on the bit line BL side and outputs the signal as the read-out data Dout. On the other hand, when the present readout cycle is not between the standby cycle in the period T1 and the standby cycle in the period T2 shown in FIG. 3, the selector 11 selects a signal on the bit line BLB side and outputs the signal as the read-out data Dout.

On the other hand, when data is written in a memory cell in the state in which the read state or the write state is designated by the chip enable signal CE, the external address ADD is input to the selector 8 and the address comparator 15 and the external writing signal W is input to the selector 9. The written data Din is input to the selector 13 and the inverter 17.

When the external address ADD is input to the selector 8 in the state in which the output of the standby detection signals NOP1 and NOP2 is stopped, the selector 8 selects the external address ADD and outputs the external address ADD to the row decoder 2 and the column decoder 18. The row decoder 2 and the column decoder 18 select the word line WL and the bit line BL and BLB designated by the external address ADD.

When the external writing signal is input to the selector 9 in the state in which the output of the standby detection signals NOP1 and NOP2 is stopped, the selector 9 selects the external writing signal W and outputs the external writing signal W to the readout/writing control circuit 6. The readout/writing control circuit 6 outputs the write enable signal WE to the data latch/writing control circuit 4.

When the external address ADD is input to the address comparator 15, the address comparator 15 compares the external address ADD and the internal address add and outputs a comparison result COMP of the comparison to the selector 13. When the external address ADD is higher in number than the internal address add, the selector 13 selects the written data Din and outputs the written data Din to the selector 7. On the other hand, when the external address ADD is lower in number than the internal address add, the selector 13 selects the output of the inverter 17 and outputs data obtained by inverting the written data Din to the selector 7.

When the output of the selector 13 is input to the selector 7 in the state in which the output of the standby detection signals NOP1 and NOP2 is stopped, the selector 7 selects the output of the selector 13 and outputs the output to the data latch/writing control circuit 4.

When the write enable signal WE is output to the data latch/writing control circuit 4, the data latch/writing control circuit 4 sets the potential of the bit lines BL and BLB according to the output of the selector 13. When the external address ADD is higher in number than the internal address add, the data latch/writing control circuit 4 writes the written data Din in the memory cell. When the external address ADD is lower in number than the internal address add, the data latch/writing control circuit 4 writes the data obtained by inverting the written data Din in the memory cell.

When the external address ADD and the internal address add are equal, the NOP controller 12 determines whether the present readout cycle is between the standby cycle in the period T1 and the standby cycle in the period T2 shown in FIG. 3. When the present readout cycle is between the standby cycle in the period T1 and the standby cycle in the period T2 shown in FIG. 3, the data latch/writing control circuit 4 writes the data obtained by inverting the written data Din in the memory cell. The NOP controller 12 shifts to a standby cycle waiting state before the output of the standby detection signal NOP1. On the other hand, when the present readout cycle is not between the standby cycle in the period T1 and the standby cycle in the period T2 shown in FIG. 3, the data latch/writing control circuit 4 writes the data obtained by inverting the written data Din in the memory cell.

Figure 5A:
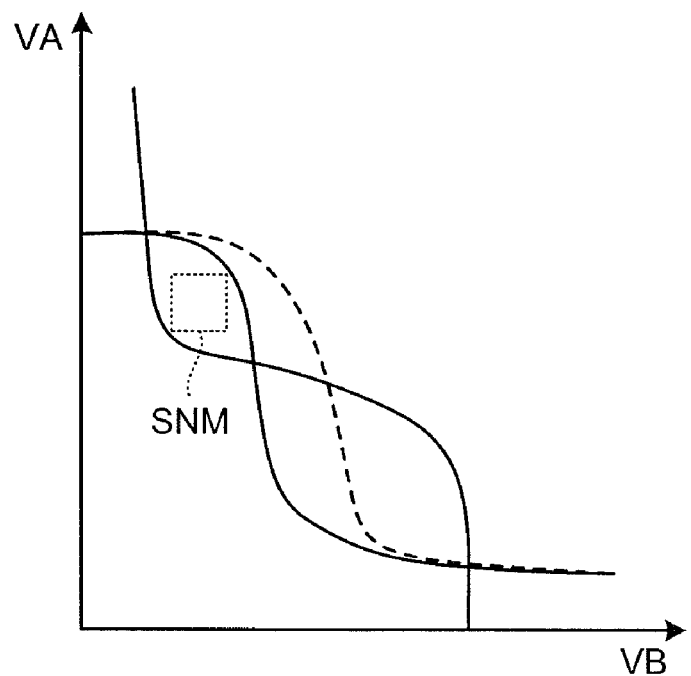
FIGS. 5A and 5B are diagrams of comparison of a data storage characteristic of the semiconductor memory device shown in FIG. 1 and a conventional example.
Figure 5B:
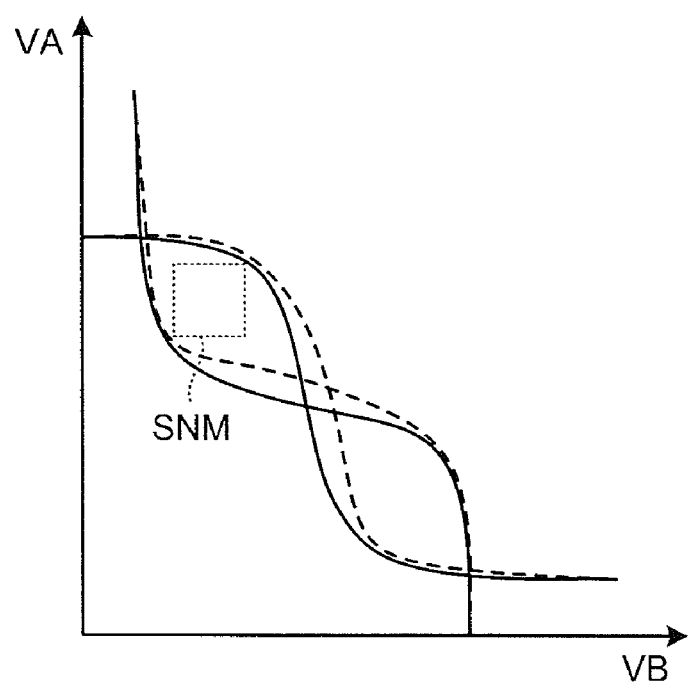

FIGS. 5A and 5B are diagrams of comparison of a data storage characteristic of the semiconductor memory device shown in FIG. 1 and a conventional example. The ordinate in FIG. 5 indicates voltage VA of the storage node A shown in FIG. 2 and the abscissa in FIG. 5 indicates voltage VB of the storage node B shown in FIG. 2.

In FIG. 5A, when a logical value '0' and a logical value '1' are respectively stored in the storage node A and the storage node B shown in FIG. 2 for a long period, a state in which the Pch transistor P1 is off and the Pch transistor P2 is on lasts for a long period. Therefore, only a characteristic of the Pch transistor P2 is deteriorated with time by NBTI and the balance of a latch characteristic of a memory cell is broken. Therefore, a signal noise margin SNM decreases.

On the other hand, in FIG. 5B, when logical values of the storage nodes A and B shown in FIG. 2 are alternately inverted, the Pch transistors P1 and P2 are alternately turned on and off. Therefore, the aged deterioration of the characteristics of the Pch transistors P1 and P2 can be uniformalized and the balance of latch characteristic of a memory cell can be maintained. Therefore, it is possible to suppress the decrease in the signal noise margin SNM.

Figure 6:
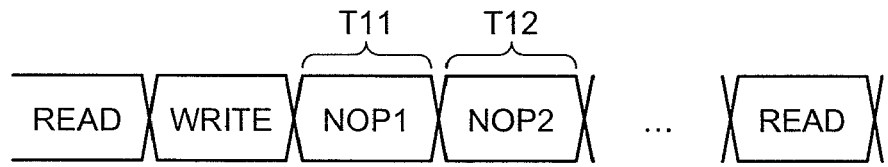
FIG. 6 is a timing chart of inversion timing for data according to a second embodiment of the present invention.
Figure 7:
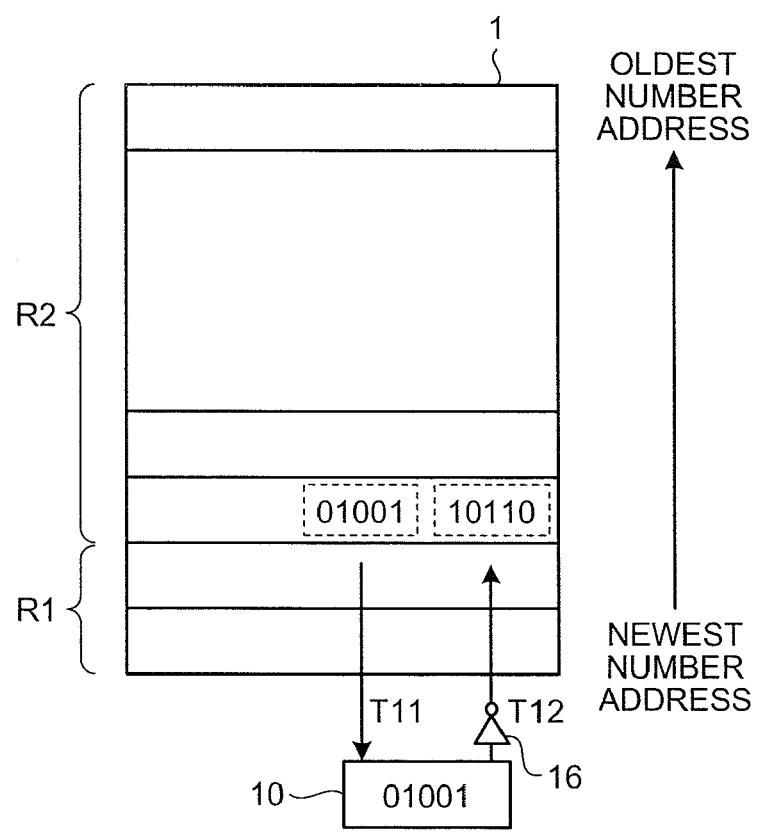
FIG. 7 a diagram of an address map of inverted data according to the second embodiment.

FIG. 6 is a timing chart of inversion timing for data according to a second embodiment of the present invention. FIG. 7 is a diagram of an address map of inverted data according to the second embodiment.

In FIGS. 6 and 7, when a standby state such as a sleep state lasts, the NOP controller 12 continuously outputs the standby detection signals NOP1 and NOP2. In a period T11 in which the standby detection signal NOP1 is output, data '01001' is read out from a region designated by the internal address add and stored in the register 10. Subsequently, in a period T12 in which the standby detection signal NOP2 is output, the data '01001' stored in the register 10 is inverted by the inverter 16 and data '10110' is written in the region designated by the internal address add.

Because the standby detection signals NOP1 and NOP2 are continuously output, it is possible to prevent a read cycle or a write cycle from occurring between standby cycles in the periods T11 and T12. Therefore, it is unnecessary to determine whether the external address ADD and the internal address add are equal. It is possible to make a circuit for determining whether the external address ADD and the internal address add are equal unnecessary.

Figure 8:
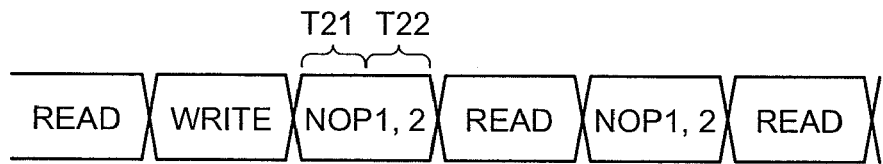
FIG. 8 is a timing chart of inversion timing for data according to a third embodiment of the present invention.
Figure 9:
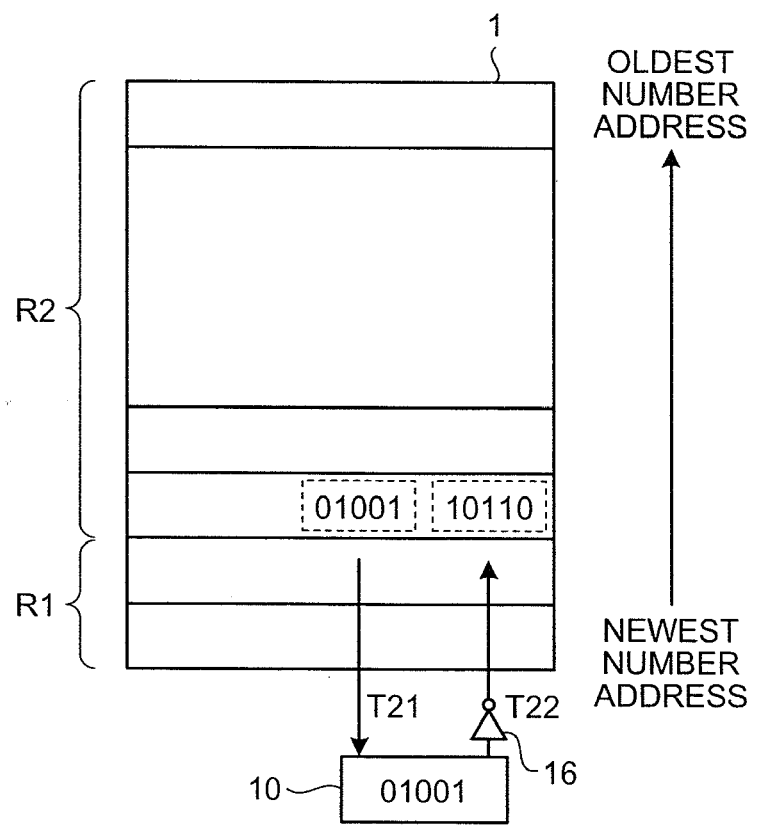
FIG. 9 is a diagram of an address map of inverted data according to the third embodiment.

FIG. 8 is a timing chart of inversion timing for data according to a third embodiment of the present invention. FIG. 9 is a diagram of an address map of inverted data according to the third embodiment.

In FIGS. 8 and 9, when the NOP controller 12 detects a standby state, the NOP controller 12 continuously outputs the standby detection signals NOP1 and NOP2 in a standby cycle for one cycle. In a period T21 in which the standby detection signal NOP1 is output, data '01001' is output from a region designated by the internal address add and stored in the register 10. In a period T22 in which the standby detection signal NOP2 is output, the data '01001' stored in the register 10 is inverted by the inverter 16. Data '10110' is written in the region designated by the internal address add.

Because the standby detection signals NOP1 and NOP2 are continuously output during the standby cycle for one cycle, it is possible to prevent a read cycle or a write cycle from occurring between the periods T21 and T22. Therefore, it is possible to make a circuit for determining whether the external address ADD and the internal address add are equal unnecessary.

In the embodiments, the method of generating the inverted region R1 from a lowest number address to an highest number address by incrementing the internal address add every time the inversion writing operation is executed in address units is explained. However, the inverted region R1 can also be generated from an highest number address to a lowest number address by decrementing the internal address add every time the inversion writing operation is executed in address units.

In the embodiments, the method of starting the inversion writing operation every time the standby state is designated is explained. However, the inversion writing operation does not always have to be started in the standby state of all the cycles. A period in which the inversion writing operation is started can also be set by a timer or the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a memory cell array comprising memory cells in a matrix arrangement;
a data inverter configured to invert data in the memory cells and to write the inverted data in the memory cells;
an address counter configured to increment or decrement an internal address when the data inverter writes the inverted data;
a decoder configured to select a first memory cell comprising data to be inverted by the data inverter based on the internal address designated by the address counter; and
an address comparator configured to determine whether the data from a memory cell of an external address is inverted and written based on a first result of comparison of an external address and the internal address in a readout cycle, and to determine whether the data written into a memory cell of the external address is inverted based on a second result of comparison of the external address and the internal address in a writing cycle.

2. The semiconductor memory device of claim 1, further comprising a no operation (NOP) controller configured to cause the data inverter to invert the data during a standby cycle, wherein
the address counter is configured to increment or decrement the internal address based on a detection result of the standby cycle by the NOP controller.

3. The semiconductor memory device of claim 1, wherein the semiconductor memory device is configured to output the inverted data from the memory cell when an inverted region is designated by the external address in the readout cycle, and to output the data from the memory cell without the inversion when a non-inverted region is designated by the external address in the readout cycle.

4. The semiconductor memory device of claim 1, wherein the semiconductor memory device is configured to write the inverted written data in the memory cell when an inverted region is designated by the external address in the writing cycle, and to write the written data in the memory cell without data inversion when a non-inverted region is designated by the external address in the writing cycle.

5. The semiconductor memory device of claim 2, wherein the NOP controller is configured to cause the semiconductor memory device to read out the data in the memory cell during a first standby cycle and to cause the data inverter to invert the data and to write the data in the memory cell during a second standby cycle next to the first standby cycle.

6. The semiconductor memory device of claim 5, wherein the first standby cycle and the second standby cycle are continuous.

7. The semiconductor memory device of claim 2, wherein the NOP controller is configured to cause the semiconductor memory device to read out the data in the memory cell, and configured to cause the data inverter to invert the data and to write the data in the memory cell during a standby cycle for one cycle.

8. The semiconductor memory device of claim 1, wherein the memory cell comprises a flip flop comprising outputs and inputs of a pair of Complementary Metal Oxide Semiconductor (CMOS) inverters cross-coupled to each other.

9. The semiconductor memory device of claim 1, wherein the data inverter comprises:
a register configured to store the data from the memory cell;
an inverter configured to invert the data in the register; and
a data latch and write controller configured to set potential of a bit line for selecting the memory cell in a column direction either to a high level or to a low level according to the inverted data.

10. A semiconductor memory device comprising:
a memory cell array comprising memory cells in a matrix arrangement;
a row decoder configured to select a memory cell to be accessed in a row direction;
a column decoder configured to select a memory cell to be accessed in a column direction;
a sense amplifier configured to amplify a signal from the memory cell in order to detect whether data in the memory cell is a logical value 0 or a logical value 1;
a word line configured to transmit a signal exchanged between the row decoder and the memory cell;
a bit line configured to transmit a signal exchanged between the sense amplifier and the memory cell;
an address counter configured to generate an internal address;
an address comparator configured to compare the internal address from the address counter and an external address from the outside and to determine whether an inverted region is designated or a non-inverted region is designated by the external address;
an NOP controller configured to cause the semiconductor memory device to read data from the memory cell, invert the read-out data, and to write the data in the memory cell during a standby cycle;
a register configured to store the data detected by the sense amplifier;
a first inverter configured to invert the data in the register;
a second inverter configured to invert written data;
a first selector configured to select a detection value of a signal of a first bit line of a complementary pair, based on a result of the comparison of the address comparator;

a second selector configured to select the written data or the inverted written data based on the result of the comparison of the address comparator;

a third selector configured to select either the data selected by the second selector or the data inverted by the first inverter based on a command from the NOP controller; and a data latch and write controller configured to set potential of the first bit line either to a high level or to a low level according to the data selected by the third selector.

11. The semiconductor memory device of claim 10, wherein the address counter is configured to increment or decrement the internal address when the NOP controller causes the semiconductor memory device to read out data from the memory cell during the standby cycle.

12. The semiconductor memory device of claim 10, wherein the first selector is configured to select a detection value of a signal of first bit line in the complementary pair when the inverted region is designated by the external address in a readout cycle, and to select a detection value of a signal of a second bit line in the complementary pair when the non-inverted region is designated by the external address in the readout cycle.

13. The semiconductor memory device of claim 10, wherein the second selector is configured to select the data inverted by the second inverter when the inverted region is designated by the external address in a writing cycle, and to select the written data when the non-inverted region is designated by the external address in the writing cycle.

14. The semiconductor memory device of claim 10, wherein the NOP controller is configured to cause the semiconductor memory device to read out the data in the memory cell during a first standby cycle, to invert the data and to write the data in a second standby cycle next to the first standby cycle.

15. The semiconductor memory device of claim 14, wherein the third selector is configured to select the data inverted by the first inverter when the third selector receives a writing command from the NOP controller, and to select the data selected by the second selector when the third selector does not receive a write command from the NOP controller.

16. The semiconductor memory device of claim 10, wherein the memory cell comprises:
a first CMOS inverter comprising a first P-channel field effect transistor and a first N-channel field effect transistor connected in series as a first storage node;
a second CMOS inverter comprising a second P-channel field effect transistor and a second N-channel field effect transistor connected in series as a second storage node, a gate of the first P-channel field effect transistor and a gate of the first N-channel field effect transistor connected to the second storage node, and a gate of the second P-channel field effect transistor and a gate of the second N-channel field effect transistor connected to the first storage node;
a third N-channel field effect transistor connected between the first storage node and a first bit line of the complementary pair; and
a fourth N-channel field effect transistor connected between the second storage node and a second bit line of the complementary pair.

17. A method of updating data in a semiconductor memory device, the method comprising:
reading data in memory cells in a matrix arrangement in a memory cell array in a standby cycle, inverting the read data, and writing the read data in the memory cells;
determining whether a region designated by an external address in a readout cycle is an inverted region or a non-inverted region;
outputting data after inverting the read data in the readout cycle when the region designated by the external address is the inverted region;
outputting the read data in the readout cycle without inversion when the region designated by the external address is the non-inverted region;
determining whether a region designated by an external address in a writing cycle is the inverted region or the non-inverted region;
writing data after inverting written data in the memory cells in the writing cycle when the region designated by the external address is the inverted region; and
writing the written data in the memory cells without inversion in the writing cycle when the region designated by the external address is the non-inverted region.

18. The method of updating data in a semiconductor memory device of claim 17, wherein the readout and the writing of the data in the standby cycle are executed in order from a lowest number address to an highest number address.

19. The method of updating data in a semiconductor memory device of claim 17, wherein the readout and the writing of the data in the standby cycle are executed in order from an highest number address to a lowest number address.

* * * * *